United States Patent [19]

Shepherd et al.

[11] Patent Number: 5,021,754

[45] Date of Patent: Jun. 4, 1991

[54] FRACTIONAL-N SYNTHESIZER HAVING MODULATION SPUR COMPENSATION

[75] Inventors: Wayne P. Shepherd; Darrell E. Davis, both of Sunrise; Wan F. Tay, Coral Springs, all of Fla.

[73] Assignee: Motorola, Inc., Schaumburg, Ill.

[21] Appl. No.: 553,472

[22] Filed: Jul. 16, 1990

[51] Int. Cl.$^5$ .................. H03C 3/00; H03L 7/197
[52] U.S. Cl. .................. 332/128; 331/1 A; 331/16; 331/25; 455/112; 455/119
[58] Field of Search .............. 332/127, 128; 331/1 A, 331/16, 18, 25; 455/42, 75, 76, 112, 113, 119

[56] References Cited

U.S. PATENT DOCUMENTS

| | | | |
|---|---|---|---|
| 4,068,199 | 1/1978 | Madoff | 331/25 X |
| 4,481,489 | 11/1984 | Kurby | 331/23 X |
| 4,543,542 | 9/1985 | Owen | 331/23 X |
| 4,546,331 | 10/1985 | Da Silva et al. | 455/113 X |
| 4,562,414 | 12/1985 | Linder et al. | 332/117 |
| 4,573,026 | 2/1986 | Curtis et al. | 332/124 |
| 4,609,881 | 9/1986 | Wells | 331/1 A |
| 4,686,488 | 8/1987 | Attenborough | 331/2 |
| 4,810,977 | 3/1989 | Flugstad et al. | 455/113 X |
| 4,816,774 | 3/1989 | Martin | 331/1 A |

Primary Examiner—Siegfried H. Grimm
Attorney, Agent, or Firm—Robert S. Babayi

[57] ABSTRACT

A synthesizer circuit with spur compensation utilizes fractional division in the synthesizer loop. The fractional divider includes means for compensating the spurs when the fractional numerator N=0. The synthesizer includes means for selecting a reference divisor R such that a non zero value of fractional numerator is produced and such that the generated spurs fall below the side band noise limits of the synthesizer's voltage controlled oscillator.

6 Claims, 4 Drawing Sheets

5,021,754

FRACTIONAL-N SYNTHESIZER HAVING MODULATION SPUR COMPENSATION

BACKGROUND OF THE INVENTION

This invention relates to frequency synthesizers in general, and more particularly to fractional-N-frequency synthesizers for producing variable modulated output frequency $f_{out}$.

Frequency synthesizers generally comprise phase lock loop (PLL) circuits which provides many frequency outputs from a single reference frequency. In a PLL circuit, various output frequencies $f_{out}$ may be produced by varying a loop divisor K. The loop divisor K is programmed into a programmable divider circuit in order to set the desired output frequency $f_{out}$. The output of the programmable divider is applied to a phase detector which operates in a conventional manner comparing the phase of the divided output signal with a reference frequency $f_{ref}$ from a reference oscillator. The output of the VCO is locked to the desired frequency when no phase error exists between the phase detector inputs. Accordingly, the output frequency of the synthesizer $f_{out} = K^* f_{ref}$.

Fractional-N-synthesizers may be used to increase the frequency resolution of the PLL circuit as well as maintaining a fast frequency lock time. In fractional-N synthesizers, the output frequency $f_{out}$ is related to a reference frequency source by the relationship $f_{out} = (M.F.) \times f_{ref}$. Where M.F is equal to the divisor value K. In the fractional synthesizer, (M.F) is produced by a fractional loop divider and consists of an integer part M and a fractional part F. The fractional part F is equal to N/D where N is a fractional numerator and D is a fractional denominator. N and D comprise integer numbers. When $f_{out}$ is an integer multiple of the $f_{ref}$, the fractional part F as well as N are equal to zero. On the other hand, when $f_{out}$ is not an integer multiple of the $f_{ref}$, the M.F is a real value for all the non-zero values of N. Because a digital divider operates with integer values, fractional division is simulated by switching between different integer values of divisors such that the average divisor value is equal to the loop divisor K. However, this switching of the divisors results in spurious sidebands. The goal in designing a synthesizer is to keep the amplitudes of these sub-harmonic spurs below some acceptable limit.

In a fractional-N synthesizer disclosed by Martin in U.S. Pat. No. 4,816,774, the spurious side bands are improved by providing dual accumulator compensation means. In Martin's fractional N-synthesizer, the compensating means reduce the generated spurs for all non-zero values of N by integrating the fundamental. An offset value may be selectively introduced in the accumulators in order to produce a wave from having an acceptable spurious content. However, Martin's fractional synthesizer does not provide any compensation, when N is equal to zero because the spurious signals are generated only when the programmable divider performs a fractional division. No spur is generated when the programmable divider performs an integer division.

In some applications, such as in transmitter local oscillator applications, it may become necessary to modulate the output frequency $f_{out}$ with a modulating signal which may contain voice or data messages. In these applications the divider value of the programmable divider as well as the VCO are modulated with the modulating signal. One such method of modulation is disclosed in a pending U.S. patent application Ser. No. 07/499,102 filed on Mar. 26, 1990, now U.S. Pat. No. 4,994,768, and assigned to the assignee of the present application. In this method, the programmable divider is modulated by varying the loop divisor K in accordance with the digital representation of the modulating signal. In cases where $f_{out}$ is an integer multiple of the $f_{ref}$ (i.e. N=0) application of the modulating signal may provide an instantaneous non-zero value for N. Therefore, the fractional N synthesizer of the prior art may not compensate for the generated spurs due to instantaneous non-zero value of N which is caused by the application of the modulating signal since compensation only occurs for non-zero values of N.

SUMMARY OF THE INVENTION

Accordingly, it is the object of the present invention to provide a fractional N-synthesizer which compensates for spurs generated due to application of a modulating signal.

The fractional-N frequency synthesizer for providing a modulated output frequency $f_{out}$ comprises a synthesizer loop which includes a voltage controlled oscillator for providing the output frequency $f_{out}$. The output frequency $f_{out}$ is equal to $K^* f_{ref}$. A fractional loop divider divides the output frequency $f_{out}$ by a fractional modulus J which is equal to $J = M + N/D$ where:

M = integer divisor
N = fractional numerator
D = fractional denominator.

The programmable divider compensates for the generated spurs of the frequency synthesizer when N is equal to a non-zero integer. The synthesizer also includes modulation means for varying the modulus of the fractional loop divider in accordance with a modulating signal. A reference divisor R is selected to provide a reference frequency $f_{ref}$ so as to provide a non-zero fractional numerator N.

DESCRIPTION OF THE PREFERRED EMBODIMENT

Figure 1:
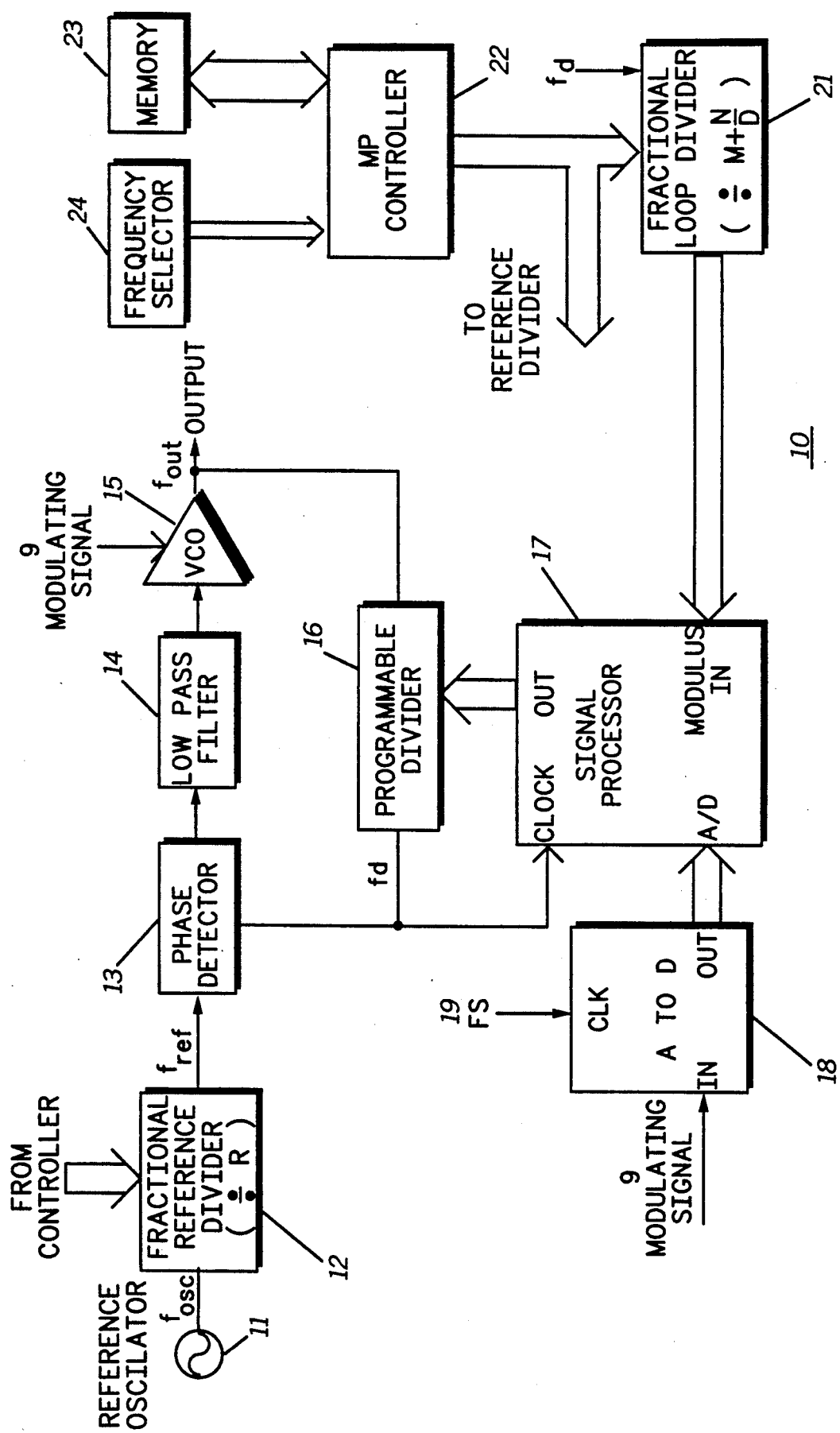
FIG. 1 is a block diagram of a fractional-N frequency synthesizer with spur compensation in accordance with the present invention.

Referring to FIG. 1, a block diagram of a fractional-N frequency synthesizer 10 according to the present invention is shown. The frequency synthesizer 10 utilizes well known phase locked loop (PLL) principals for generating various frequency outputs $f_{out}$ from a single reference frequency $f_{ref}$. In the preferred embodiment of the invention, the synthesizer 10 comprise the means for generating the transmitter and/or receiver local oscillator frequency for a mobile or a portable communication unit (not shown), such as a two-way radio. The synthesizer 10 includes a reference oscillator 11 for generating an oscillation frequency Fosc. In the preferred embodiment of the invention the reference oscillator 11 comprises a crystal oscillator having an oscillator frequency Fosc=16.8 MHZ. The oscillator output is applied to programmable fractional reference divider 12 which provides the reference frequency $f_{ref}$ for the synthesizer 10. The fractional reference divider 12 divides the oscillator frequency Fosc by a programmable reference divisor R to provide reference frequency $f_{ref}$. Accordingly, Fosc=R* $f_{ref}$.

A phase detector 13 compares the phase difference between the output of fractional reference divider 12 and output of a programmable divider 16 and provides a phase error voltage or current according thereto. The phase error voltage is coupled to a voltage controlled oscillator (VCO) 15 via a low pass filter 14. The VCO locks to a desired output frequency $f_{out}$, when no phase error exists between the inputs of the phase detector 13. The output of the VCO 14 is connected to the programmable divider 16. The output of the programmable divider 16 has a divider frequency $f_d$ which as well as being applied to the phase detector 13 provides a clock input for a signal processor 17 and a fractional loop divider 21. The signal processor 17 is connected to the programmable divider 16 which divides the output frequency $f_{out}$ by a loop divisor K. The loop divisor K is a ratio by which the output frequency $f_{out}$ is divided and compared to the $f_{ref}$ and accordingly the following relationship exists between the frequency output $f_{out}$ and reference frequency $f_{ref}$:

$$f_{out} = K * f_{ref}.$$

It is well known in the art that in a fractional-N synthesizer it may be necessary to periodically adjust the loop divisor K in a manner such that the average output frequency is equal to the desired output frequency $f_{out}$. In the preferred embodiment of the invention, the frequency synthesizer 10 is capable of providing an FM modulated output frequency $f_{out}$. The modulation of the output frequency is accomplished by a phase modulation technique in which the loop divisor K is varied with time as a function of a modulating signal 9 and a fractional modulus J. The signal processor 17 receives the fractional modulus J form a fractional loop divider 21 and modulates it in accordance with a digital representation of the modulating signal 9 provided by an analog to digital converter (A/D converter) 18. The phase modulation is achieved by introducing to the loop divisor K a variation which is a function of the instantaneous amplitude of the modulating signal 9. The variation in loop divisor K causes a phase perturbation in the loop. The perturbation in the loop can be measured at the output of the VCO 15 as variation in frequency proportional to the amplitude of the modulating signal 9. It is well known that a PLL circuit attenuates frequency components of the modulating signal above the PLL unity gain frequency. Therefore, the modulating signal 9 must be additionally applied to the VCO 15 if frequency components of the modulating signal exceed the unity gain frequency of the PLL. This technique is known as two spot modulation. Accordingly, the VCO 14 may receive a modulating signal 9 that directly modulates the VCO using well known techniques, such as direct frequency modulation (FM). As will be described below, the signal processor 17 includes means for modulating the fractional modulus J in accordance with the modulating signal 9. The A/D convertor 18 is clocked in by a sampling signal 19 at an arbitrary rate $f_s$.

The fractional loop divider 21 comprises a programmable fractional divider identical to the fractional divider described in Martin, U.S. Pat. No. 4,816,774 titled "Frequency Synthesizer with Spur compensation" and assigned to the assignee of the present invention which is hereby incorporated by reference. The fractional loop divider 21 may be programmed via a controller 22 to generate the desired fractional modulus J. The fractional modulus J is determined by the following formula:

$$J = M + N/D$$

where:
M=integer divisor
N=fractional numerator
D=fractional denominator.

One of ordinary skill in the art will appreciate that the fractional denominator D sets minimum frequency steps by which the output frequency $f_{out}$ may be incremented. The frequency steps are therefor determined by the ratio of $f_{ref}/D$. It is well known that in radio communication applications where the synthesizer 10 is utilized as a local oscillator, the frequency steps determine the achievable channel spacing of the communication system. In this applications the frequency step must be an integer multiple of the channel spacing. For example, in a communication system having a 25 kHz channel spacing, the frequency steps may comprise 1, 1.25, 5, 6.25, 12.5 or 25 kHz.

The controller 22 comprises any well known microcomputer, such as a MC68HC11 family of microcomputers manufactured by Motorola Inc. The controller 22 provides the reference divisor R for the fractional reference divider 12. In the preferred embodiment of the invention the fractional reference divider 12 comprises a fractional divider similar to the fractional divider of fractional loop divider 21. The reference divisor R may assume one of a predetermined number of integer or fractional values.

The fractional numerator N comprises the number of frequency steps by which the output frequency is incremented from M *$f_{ref}$. Accordingly if the desired frequency output $f_{out}$ is an integer multiple of reference frequency $f_{ref}$ then fractional numerator N is equal to zero. Preferably, an offset value could be added to the fractional numerator N to provide optimum spur characteristics for any desired output frequency $f_{out}$. A memory device 23 which may comprise an electrically erasable programmable read only memory (EEPROM) is utilized to contain prestored frequency data including M, N, R and D for use by the fractional loop divider 21 so as to produce appropriate fractional modulus J for a desired output frequency $f_{out}$.

The microprocessor controller 20 reads the frequency data from the memory 23 and supplies the data to the fractional loop divider 21. A frequency selector 24 is coupled to the microprocessor controller 22 for addressing the appropriate memory location which contains frequency data for the selected frequency. In applications such as two-way radios, the frequency selector may correspond to a channel switch.

Figure 2:
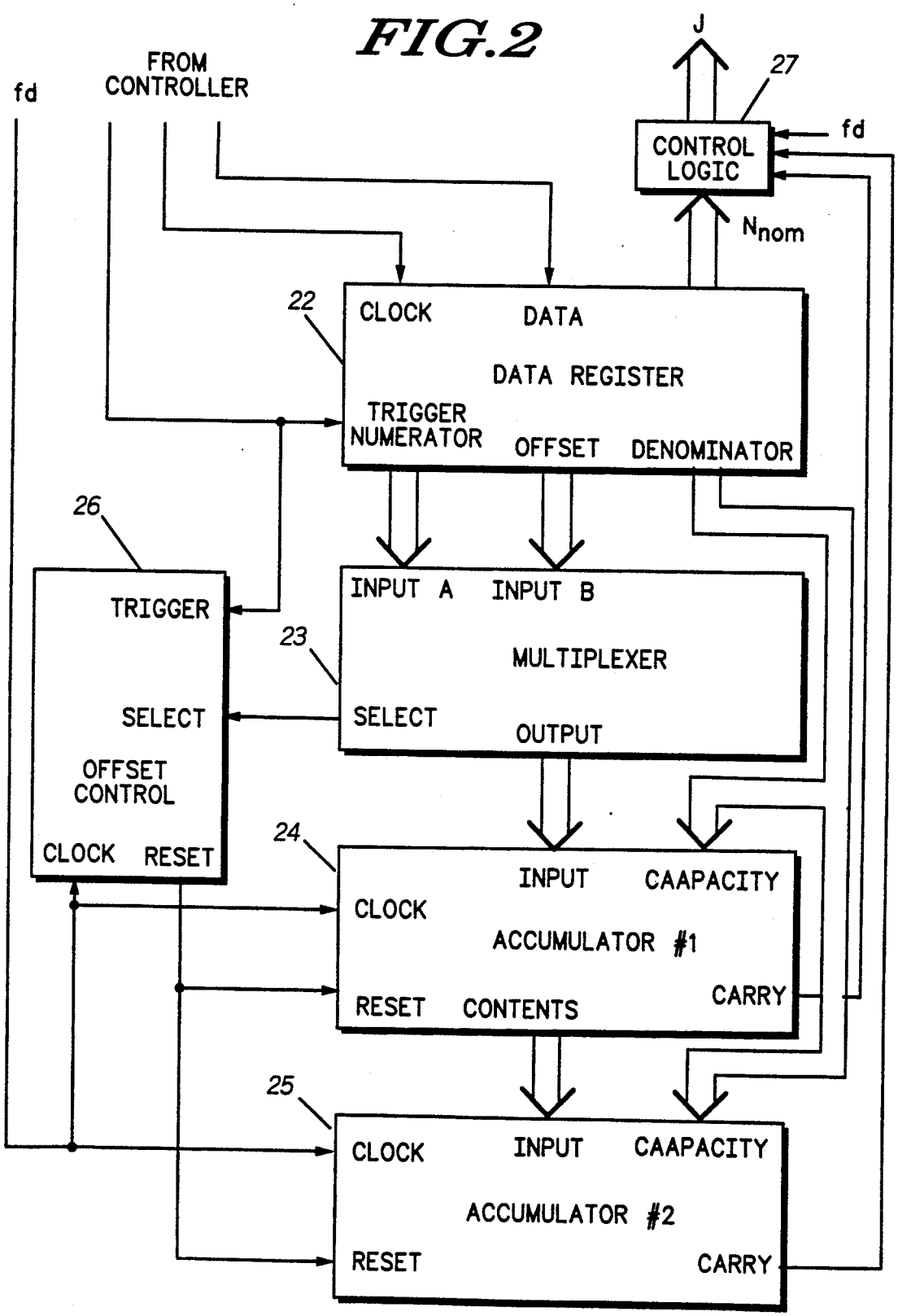
FIG. 2 is a block diagram of a fractional loop divider of the fractional-N frequency synthesizer of FIG. 1.

Referring to FIG. 2 the block diagram of the fractional loop divider 21 is shown. The detailed operation of the fractional loop divider 21 is fully described in the issued patent to Martin. Here, the operation of fractional loop divider 21 will be described to the extent necessary for understanding of the present invention. The fractional loop divider 21 includes means for minimizing spurs generated by the fractional division operation of the fractional N-synthesizer. The desired effect is achieved by a compensating means which substantially cancels the spurs generated by the fractional division operation. The compensating means consists of data register 22, accumulators 24 and 25 with programmable inputs, a multiplexer 23, a logic control circuit 27, and an offset control circuit 26. The data register receives the fractional numerator N and offset value and the fractional denominator value D from the controller 22 of FIG. 1. The accumulator 24 comprises a clocked register with a capacity which corresponds to the fractional denominator D to which the fractional numerator N is added after each clock cycle ($f_d$ cycle). Therefore, the accumulator 24 performs a digital integration of the fractional numerator N by sequentially adding the digital representation of the modulating signal 9 in each clock cycle. Each time the accumulator capacity is reached the accumulator overflows and a carry is generated. For each clock cycle when a carry is not generated the loop divisor K counts by its programmed value. For each clock cycle that a carry is generated the modulus of the divider is increased by one. The capacity D of the accumulator is scaled such that it corresponds to a $2\pi$ radians phase addition to the loop. Therefore, the contents of the first accumulator 24 represent the instantaneous value of the difference in phase between the output frequency $f_{out}$ and the actual frequency. Over D cycles of the divider output, N carry pulses are produced by the accumulator and the average value of the divider modulus has an integer divider part M equal to the programmed value of the divider and a fractional part equal to N/D. Thus a non-integer value for the fractional modulus J is created. It should be noted, however, that the difference between the average divider modulus and the instantaneous fractional modulus J causes a well defined and predictable phase perturbation to the PLL. This causes predictable and well defined spurs at the output of the PLL having a fundamental frequency equal to 1/D. A second accumulator 25 to which the instantaneous contents of the accumulator 24 is summed at each cycle of the divider output, performs a digital integration of the contents of the accumulator 24. For each clock cycle in which the second accumulator capacity is reached, the divider modulus is increased by one from its programmed value. On each succeeding clock cycle, the divider modulus is decreased by one from its programmed value. The net effect on the average fractional modulus J is equal to zero since counts are always added and subtracted in pairs. This operation has the effect of differentiating the output of the accumulator 25. The phase introduced to the loop by this mechanism is equivalent to the derivative of the integral of the first accumulator 24 contents. This compensation mechanism has the effect of minimizing low frequency components of the spurious waveform and enhancing components at or near $\frac{1}{2}$ the synthesizer reference frequency $f_{ref}$. This is desirable since the PLL acts as a low pass filter and attenuates the high frequency components of the wave form. The fourier analysis of the output of the synthesizer 10 shows a substantial improvement in the generated spurs. The spur improvements may be furthered by increasing the capacity of the accumulators or the value of fractional denominator D. However, the increase in the value of D is limited by the number of bits allocated to the capacity of the accumulators 24 and 25. It may be appreciated that the optimal value for the offset varies with N, D and the required application.

Since the spurs generated by the fractional N-synthesizer are predictable, a computer program could be written to determine optimal values of N, D, and offset value which provide the optimum spur characteristic for any desired frequency under a specific reference frequency and channel spacing requirement. These optimal values are stored in the memory 23.

One of ordinary skill in the art will appreciate that the spur compensation only occurs for all the non-zero values of fractional numerator N. When N=0 there the phase perturbations due to the fractional division operation are nonexistent and accordingly there is no need for a fractional division operation.

Figure 3:
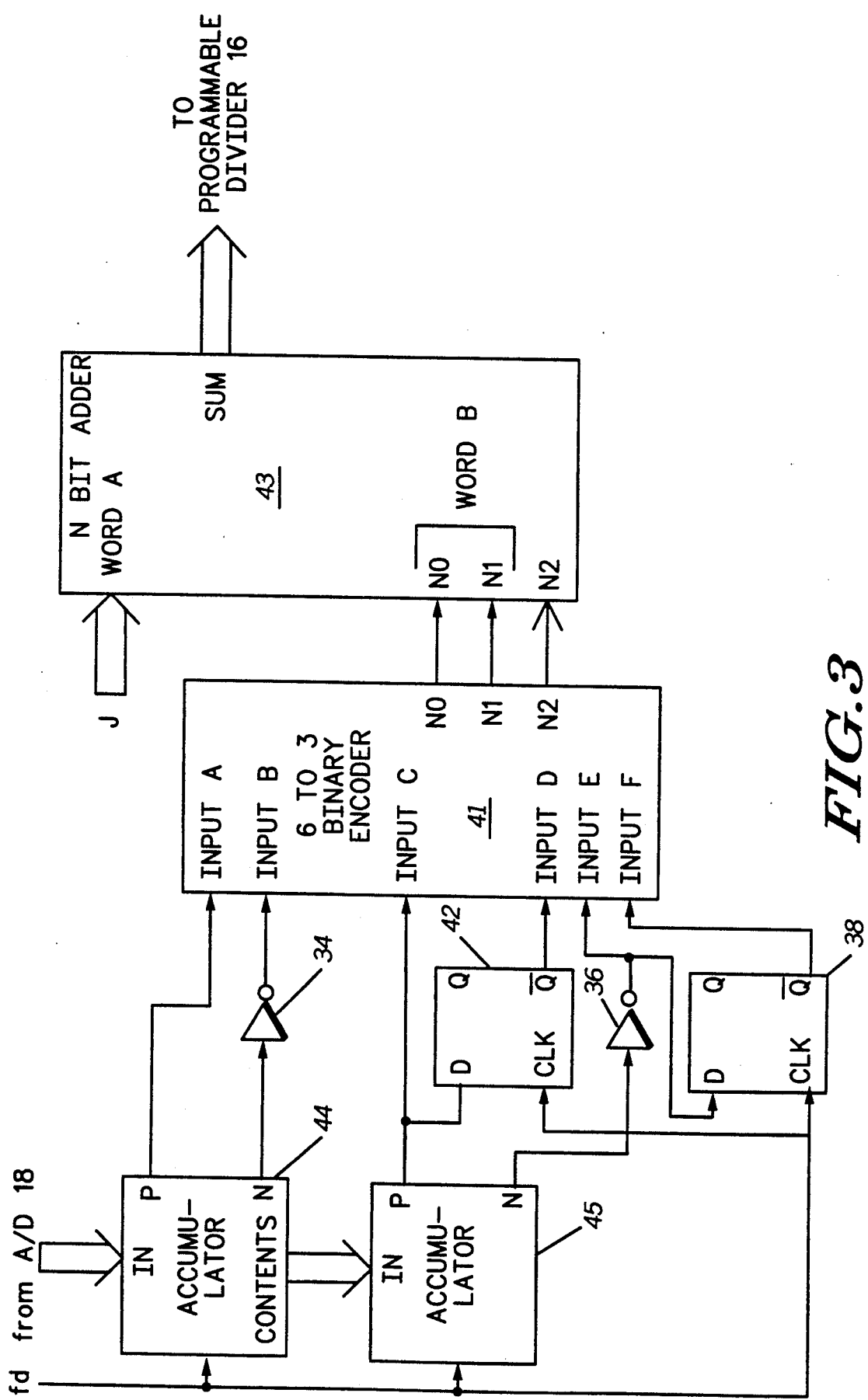
FIG. 3 is a block diagram of a signal processor of the fractional-N frequency synthesizer of FIG. 1

Referring to FIG. 3, a block diagram showing hardware implementation of the signal processor 17 is shown. The signal processor 17 is fully described in the pending U.S. patent application Ser. No. 07/499,102 filed on Mar. 26, 1990, now U.S. Pat. No. 4,994,768, and assigned to the assignee of the present application which is hereby incorporated by reference. The signal processor includes accumulators 44 and 45 having parallel inputs IN, clock input, positive and negative carry outputs N and P, and C bit contents. The parallel input IN of the accumulator 44 is coupled to the output of the D/A converter 18 of FIG. 1. The accumulator 44 performs a digital integration of the modulating signal 9 by sequentially adding the digital representation of the modulating signal in each clock cycle. The accumulator 44 has a pre-set capacity. When the contents of the accumulator 44 have reached the capacity, a positive carry or a negative carry is set depending on the polarity of the modulating signal 9. The capacity of the accumulator 44 is scaled such that it corresponds to a $2\pi$ radians phase addition to the loop. The accumulator 45 performs a digital integration of the contents of the first accumulator. The contents of the accumulator 45 represent the integral of the difference in phase between the modulating signal 9 and the signal which is modulated onto the carrier by the action of the accumulator 44. The scale of the second accumulator is set by the capacity of the accumulator. Capacity in the accumulator 45 represents the equivalent to $2\pi$ radians times clock cycles, where clock cycles is a unit of time. Each time the capacity of accumulator 45 is reached, the fractional modulus J is manipulated such that its value is increased by one from its steady state value for one clock cycle, then reduced by one from its steady state value on the subsequent clock cycle. This operation has the effect of differentiating the output of the second accumulator. The phase introduced to the loop by this mechanism is equivalent to the derivative of the integral of the accumulator 44 contents. The integration and differentiation of the phase perturbation substantially decreases the spurs generated by this type of phase modulation while allowing very low frequency modulation of the output frequency even though substantially high reference frequency is utilized. In the preferred embodiment of the invention a phasor relationship is established by combining the carry outputs of the accumulators 44 and 45 via the inverters 36 and 34, D flip-flops 42 and 38, and a binary encoder 41. It may be appreciated that the phasor relationship may be arbitrarily selected to accommodate any desired application. The output of the binary encoder 41 comprises a word B which defines the phasor relationship. A binary adder 43 adds the word B to the fractional modulus J and provides the loop divisor K. From the above description it may be appreciated that the loop divisor K comprises an instantaneously varying integer when the fractional numerator N is a non-zero value and/or the modulating signal 9 is present.

When the output frequency $f_{out}$ is an integer multiple of the reference frequency $f_{ref}$, i.e. N=0, the instantaneous variations of loop divisor K due to modulating signal may cause spurs that are not compensated for by the fractional loop divider 21. This is because no spur compensation is provided by the fractional loop divider 21 when fractional numerator N=0.

According to the present invention, for any desired frequency output $f_{out}$, the reference divisor R is varied to provide a reference frequency $f_{ref}$ which causes the fractional numerator N to be a non-zero value so as to cause the spur compensation means of the fractional loop divider 21 to be activated. Additionally, because the generated spurs by a fractional divider are predictable the reference divisor R is selected such that the generated spurs fall below the acceptable side band noise limits of the VCO 15. The value of the reference divisor R may be easily calculated for the side band noise limits of a particular VCO by utilizing well known computer programs which predict the generated spurs for a given reference divisor.

In the preferred embodiment of the invention, the synthesizer 10 is required to operate within a frequency range of about 10 MHz to 950 MHZ which generally is the operational frequency range of a two-way radio. The channel spacing of the communication system that utilizes the frequency synthesizer 10 may comprises 25 kHz or 12.5 kHz channel spacing. Accordingly the value of reference frequency fref and fractional denominators D of the fractional loop divider 21 and the reference divider 12 must be selected such that in addition to non-zero requirement of fractional numerator N both channel spacing requirements of the synthesizer 10 are accommodated as well.

The reference frequency $f_{ref}$ of synthesizer 10 may be selected to be one of three frequencies: 2,1 MHz, 2.4 MHz, and 2.225 MHz. It may be appreciated that an integer loop divisor K for all three values of reference frequency $f_{ref}$ can only occur when a desired frequency $f_{out}$ of beyond at least 1400 MHZ is required. The output frequencies beyond 1400 MHZ are not within the operable frequency range of the synthesizer 10. Therefore, a fractional loop divisor K, i.e. non-integer value, may be produced for any desired frequency within the operational frequency range of the synthesizer 10 by utilizing one of the above three reference frequencies. The above reference frequencies may be produced by dividing the reference oscillator frequency Fosc (Fosc=16.8 MHZ) by one of reference divisors R=7, or R=8, or R=7 49/89. Accordingly, the fractional reference divider 12 may be programmed to the appropriate reference divisor R to produce a non-zero fractional numerator N. The reference divider 12 is programmed by the controller 21 based to one of the reference divisors R by retrieving the appropriate reference divisor R from the memory 23. The reference divisor R comprises a prestored frequency data in the memory 23 the value of which is selected based on the desired output frequency $f_{out}$.

Figure 4:
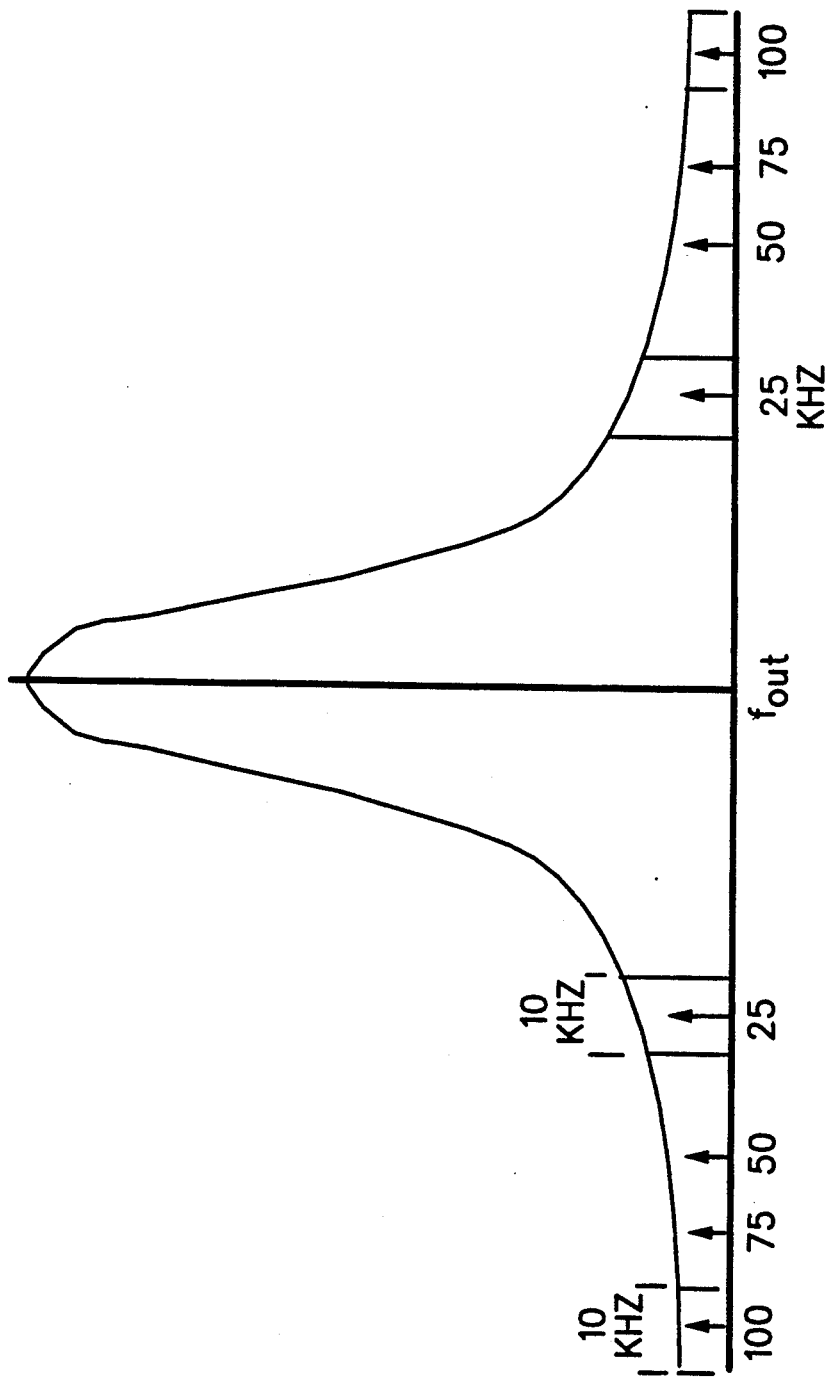
FIG. 4 is a graph of the side band noise of a voltage controlled oscillator of the fractional-N frequency synthesizer of FIG. 1.

As mentioned above, the fractional divider 12 generates predictable spurs which may be identified utilizing well known computer programs. The reference frequency $f_{ref}$ and the divider ratio R therefore may be selected to generate spurs having amplitude and frequencies within a desired frequency band. For example, the reference frequency $f_{ref}$=2.225 and the corresponding reference divisor R=7 49/89 is selected such that a frequency resolution of 25 kHz, i.e. 2.225/89, maybe provided which accommodates a 25 kHz and 12.5 kHz channel spacing. Additionally, the generated spurs due to utilizing a reference divisor R=7 49/89 are found to be below the side band noise limits of the VCO 15. Referring to FIG. 4 a frequency vs amplitude graph of the output of the VCO 15 for an exemplary $f_{out}$=453.900 MHZ is shown. The horizontal axis of this graph illustrates the output frequency spectrum of the VCO 15 which includes the output frequency $f_{out}$ and the offset frequency spurs generated at 25 kHz intervals. The horizontal axis illustrates the amplitudes at the output frequency spectrum of the VCO 15. The level of predicted spurs at the offset frequencies is tabulated in the TABLE 1 below. Also included in the TABLE 1 are the 10 kHz VCO side band noise (SBN) at each of the offset spurs.

TABLE 1

| Spur Frequency (kHz) | Spur level (dbc) | 10 kHz VCO (dbc) SBN |
|---|---|---|
| 25 | −101 | −85 |
| 50 | −95 | −91 |
| 75 | −96 | −94.5 |
| 100 | −87 | −97 |
| 125 | −105 | −99 |
| 150 | −92 | −100.5 |
| 175 | −107 | −102 |

It may be noted that in each 25 kHz offset frequency the contribution of the generated spur to the SBN of the VCO 15 is negligible. It may be appreciated by one of ordinary skill in the art that at worse case the 100 kHz spur is equal to −86 dbc, i.e.(−87 dbc)+(−97 dbc). This results in a degradation in the side band noise of about −11 dbc. However, in many communication application this level is well within the communication systems specifications, such as desense and adjacent channel selectivity which is generally specified at −85 dbc.

Accordingly it may be appreciated that the reference divisor R may be selected such that the generated spurs due to the fractional division of the synthesizer 10 fall below a spectral limit, such as the VCO side band noise.

We claims

1. A frequency synthesizer for providing a modulated output frequency $f_{out}$ comprising:
   a synthesizer loop including:
     a voltage controlled oscillator for providing the output frequency $f_{out}$, said output frequency being $f_{out}$=K* $f_{ref}$ where K=the loop divisor;
     a programmable fractional loop divider for dividing the output frequency $f_{out}$ by a fractional modulus J, said fractional modulus J=M+N/D where:
       M=integer divisor
       N=fractional numerator
       D=fractional denominator; said programmable divider including compensation means for reducing the generated spurs of the frequency synthesizer when N is equal to a non-zero integer,
   modulation means for varying said modulus in accordance with a modulating signal and providing the loop divisor K;
   a fractional reference divider having a reference divider ratio R for dividing an oscillator frequency and providing a reference frequency $f_{ref}$; and means for selecting a reference divisor R, whereby a non-zero fractional numerator N is produced.

2. The frequency synthesizer of claim 1, wherein said reference divisor R is selected such that said generated spurs are below the side band noise limits of the voltage controlled oscillator.

3. The frequency synthesizer as defined in claim 1, wherein said means for selecting said reference divisor includes a memory means, the memory means having stored therein output frequency informations N, M, and D as well as the reference divisor R.

4. A radio including a synthesizer for providing modulated and unmodulated local oscillator output frequency $f_{out}$; said synthesizer comprising:

a synthesizer loop including:
  a voltage controlled oscillator for providing the output frequency $f_{out}$, said output frequency being $f_{out} = K * f_{ref}$ where K = the loop divisor,
  a programmable fractional loop divider for dividing the output frequency $f_{out}$ by a fractional modulus J, said fractional modulus $J = M + N/D$ where:
    M = integer divisor
    N = fractional numerator
    D = fractional denominator; said programmable divider including compensation means for reducing the generated spurs of the frequency synthesizer when N is equal to a non-zero integer, modulation means for varying said modulus in accordance with a modulating signal and providing the loop divisor K;

a fractional reference divider having a reference divider ratio R for dividing an oscillator frequency and providing a reference frequency $f_{ref}$; and means for selecting a reference divisor R, whereby a non-zero fractional numerator N is produced.

5. The radio of claim 4, wherein said reference divisor R is selected such that said generated spurs are below the side band noise limits of the voltage controlled oscillator.

6. The radio of claim 4, wherein said means for selecting said reference divisor includes a memory means, the memory means having stored therein output frequency informations N, M, and D as well as the reference divisor R.

* * * * *